(12) United States Patent
Ishii et al.

(10) Patent No.: US 6,911,617 B2
(45) Date of Patent: Jun. 28, 2005

(54) PLASMA DEVICE AND PLASMA GENERATING METHOD

(75) Inventors: Nobuo Ishii, Amagasaki (JP); Makoto Ando, 1-1-I-312, Ogura, Saiwai-ku, Kawasaki-shi, Kanagawa (JP)

(73) Assignees: Tokyo Electron Limited, Tokyo (JP); Makoto Ando, Kawasaki (JP)

( * ) Notice: Subject to any disclaimer, the term of this patent is extended or adjusted under 35 U.S.C. 154(b) by 4 days.

(21) Appl. No.: 10/466,306

(22) PCT Filed: Jan. 18, 2002

(86) PCT No.: PCT/JP02/00301

§ 371 (c)(1),
(2), (4) Date: Jul. 15, 2003

(87) PCT Pub. No.: WO02/058124

PCT Pub. Date: Jul. 25, 2002

(65) Prior Publication Data

US 2004/0045672 A1 Mar. 11, 2004

(30) Foreign Application Priority Data

Jan. 18, 2001 (JP) ........................................ 2001-010873

(51) Int. Cl.[7] ............................................... B23K 10/00
(52) U.S. Cl. ............................ 219/121.36; 156/345.41; 118/723 MW
(58) Field of Search ..................... 219/121.36, 121.43, 219/121.54; 315/111.41; 118/723 MW, 723 AN, 723 MR, 723 E, 723 I, 50.1, 623; 156/345.41, 345.43; 204/298.37, 298.38; 427/571

(56) References Cited

U.S. PATENT DOCUMENTS

| | | | | |
|---|---|---|---|---|
| 4,877,509 A | * | 10/1989 | Ogawa et al. | 204/298.37 |
| 6,158,383 A | * | 12/2000 | Watanabe et al. | 118/723 AN |
| 6,200,651 B1 | * | 3/2001 | Roche et al. | 427/571 |
| 6,311,638 B1 | * | 11/2001 | Ishii et al. | 118/723 MW |
| 6,417,626 B1 | * | 7/2002 | Brcka et al. | 315/111.51 |
| 2002/0148564 A1 | * | 10/2002 | Ishii et al. | 156/345.41 |

FOREIGN PATENT DOCUMENTS

| | | |
|---|---|---|
| JP | 8-111297 | 4/1996 |
| JP | 2001-345312 | 12/2001 |
| WO | 01/76329 | 10/2001 |

* cited by examiner

Primary Examiner—Quang T. Van
(74) Attorney, Agent, or Firm—Crowell & Moring LLP

(57) ABSTRACT

A desired component of an electromagnetic field in a slot antenna is selectively taken to be supplied into a vessel for generating a plasma. The angle of inclination of slots (36) relative to the circumferential direction of a radiation surface (31) of the slot antenna (30) is decreased as the position of the slots approaches the periphery of the radiation surface 31 from the center O of the radiation surface.

6 Claims, 9 Drawing Sheets

WAVEFRONT OF REFLECTED WAVE OF ELECTRIC FIELD MAGNETIC FLOW $I_{m2}$

WAVEFRONT OF PROGRESSIVE WAVE OF ELECTRIC FIELD MAGNETIC FLOW $I_{m1}$

PLASMA DEVICE AND PLASMA GENERATING METHOD

TECHNICAL FIELD

The present invention relates to a plasma device and a plasma generation method for generating a plasma by an electromagnetic field supplied into a vessel using a slot antenna which is fed with circularly polarized electromagnetic field.

BACKGROUND ART

Plasma devices are frequently used in manufacturing semiconductor devices and flat-panel displays, in forming oxide films and in such processes as crystal growth, etching and ashing, of semiconductor layers. Some plasma devices, referred to as high-frequency plasma devices, use a slot antenna for supplying a high-frequency electromagnetic field into a process vessel to generate a high-density plasma by means of the electromagnetic field. One feature of the high-frequency plasma device is that this device is fit for a wide range of uses because of its ability to generate a plasma stably even if a plasma gas has a relatively low pressure.

FIG. 11 shows an exemplary structure of a conventional high-frequency plasma device. The structure in FIG. 11 is partially shown in vertical cross section.

The plasma device has a process vessel 111 in the shape of a bottomed cylinder with its top opened. On the bottom of process vessel 111, a substrate platform 122 is fixed. This substrate platform 122 has a mount surface on which a substrate 121 to be processed is mounted. A nozzle 117 for supplying a plasma gas is provided in the sidewall of process vessel 111, and an exhaust vent 116 for vacuum pumping is provided in the bottom of process vessel 111. The top opening of process vessel 111 is closed with a dielectric plate 113 for preventing the plasma from escaping to the outside.

A radial antenna 130 which is one type of the slot antennas is provided above dielectric plate 113. This radial antenna 130 is constituted of two circular electrically-conductive plates 131 and 132 parallel to each other that form a radial waveguide 133, and an electrically conductive ring 134 which connects respective circumferential parts of conductive plates 131 and 132.

Conductive plate 131 forming the lower surface of radial waveguide 133 has a plurality of slots 136 formed therein. As shown in FIG. 12, slots 136 are concentrically formed in the circumferential direction which is orthogonal to the radial direction of conductive plate 131.

At the center of conductive plate 132 forming the upper surface of radial waveguide 133, an inlet 135 for electromagnetic field F is formed, and a high-frequency generator 144 is connected by a cylindrical waveguide 141 to inlet 135. In addition, a circular polarization converter 142 is provided at cylindrical waveguide 141 for feeding radial antenna 130 with circularly polarized electromagnetic field.

Further, the circumferential parts respectively of radial antenna 130 and dielectric plate 113 are covered with an annular shield member 112 to form a structure preventing leakage of electromagnetic field F to the outside.

Electromagnetic field F supplied from high-frequency generator 144 is converted into circularly polarized electromagnetic field by circular polarization converter 142 to be fed to radial antenna 130. Electromagnetic field F supplied into radial waveguide 133 is radially propagated from the center toward the periphery of radial waveguide 133. Electromagnetic field F then reaches conductive ring 134 and is reflected therefrom toward the center again. In this way, electromagnetic field F is propagated in radial waveguide 133 while radiated little by little from a plurality of slots 136. Electromagnetic field F radiated from slots 136 passes through dielectric plate 113 to ionize the gas in process vessel 111 and accordingly generate a plasma in an upper space S above substrate 121.

FIG. 13 conceptually shows wavefronts of electromagnetic field F at a certain instant in radial waveguide 133. A progressive wave of electromagnetic field F has the helical wavefront as indicated by the solid line while a reflected wave has the helical wavefront as indicated by the dotted line. Magnetic flow $I_{m1}$ of the progressive wave and magnetic flow $I_{m2}$ of the reflected wave are generated along respective wavefronts.

As discussed above, conventional radial antenna 130 has slots 136 formed in the circumferential direction of conductive plate 131 serving as a radiation surface. The angle of inclination of magnetic flow $I_{m2}$ of the reflected wave relative to slots 136 is almost equal to the angle of inclination of magnetic flow $I_{m1}$ of the progressive wave relative thereto, therefore, not only the progressive wave but also the reflected wave tends to be radiated from slots 136.

In some cases, however, it is undesirable that both of the progressive wave component and the reflected wave component are included in electromagnetic field F radiated from slots 136. For example, when the intervals between the slot are used for adjusting the direction of radiation of electromagnetic field F, standing waves are radiated if the reflected wave is included at a higher ratio. Then, electromagnetic field F cannot be radiated in a desired direction.

Even if the standing wave appearing in radial waveguide 133 is to be used for any positive purpose, the radiation efficiency is unsatisfactory and thus efficient supply of electromagnetic field F into process vessel 111 is impossible.

The present invention has been made to solve the above-discussed problems. One object of the present invention is to selectively take a desired component of the electromagnetic field in the slot antenna for supplying the selected component into the vessel for use in plasma generation.

Another object of the present invention is to efficiently supply the electromagnetic field in the slot antenna into the vessel for use in plasma generation.

DISCLOSURE OF THE INVENTION

A plasma device according to one aspect of the present invention includes, for achieving the objects described above, a slot antenna having a radiation surface and a plurality of slots formed in the radiation surface for supplying an electromagnetic field into a vessel, and feeding means for feeding circularly polarized electromagnetic field to the slot antenna. The slots are arranged in such a way that the angle of inclination of the slots relative to the circumferential direction of the radiation surface of the slot antenna decreases as the position of the slots approaches the periphery of the radiation surface from the center of the radiation surface.

With this slot pattern employed, the direction of the slots is closer to either the direction of the magnetic flow of a progressive wave or the direction of the magnetic flow of a reflected wave of the electromagnetic field in the antenna. Thus, one of the efficiencies of use of the magnetic flow of the progressive wave or that of the magnetic flow of the reflected wave is realized while the other is deteriorated.

Preferably, the slots of the slot antenna are formed along a helix extending from the center toward the periphery of the radiation surface.

A plasma device according to another aspect of the present invention includes a slot antenna having an internal portion (wave guide space), a radiation surface and a plurality of slots formed in the radiation surface for supplying an electromagnetic field into a vessel, and feeding means for feeding circularly polarized electromagnetic field to the slot antenna. The slots of the slot antenna are formed along a wavefront of the electromagnetic field in the internal portion of the slot antenna.

The plasma device is thus structured to have slots formed along one of respective wavefronts of the progressive wave, reflected wave and standing wave in the slot antenna and accordingly the efficiency of use of the magnetic flow of that wave having its wavefront along which the slots are formed is realized.

A plasma generation method according to one aspect of the present invention includes the steps of preparing a slot antenna having a radiation surface and a plurality of slots formed in the radiation surface, the slots being arranged in such a way that the angle of inclination of the slots relative to the circumferential direction of the radiation surface decreases as the position of the slots approaches the periphery of the radiation surface from the center of the radiation surface, and feeding circularly polarized electromagnetic field to the slot antenna thereby supplying an electromagnetic field into a vessel to generate a plasma.

According to the plasma generation method including the steps as described above and using this slot pattern, the direction of the slots is closer to either the direction of the magnetic flow of a progressive wave or the direction of the magnetic flow of a reflected wave of the electromagnetic field in the antenna. Thus, one of the efficiencies of use of the magnetic flow of the progressive wave or that of the magnetic flow of the reflected wave is realized while the other is deteriorated.

Preferably, the slots of the slot antenna are formed along a helix extending from the center toward the periphery of the radiation surface.

A plasma generation method according to another aspect of the present invention includes the steps of preparing a slot antenna having an internal portion, a radiation surface and a plurality of slots formed in the radiation surface, the slots being formed along a wavefront of an electromagnetic field in the internal portion, and feeding circularly polarized electromagnetic field to the slot antenna thereby supplying the electromagnetic field into a vessel to generate a plasma.

According to the plasma generation method including the steps as described above, the slots are formed along one of respective wavefronts of the progressive wave, reflected wave and standing wave in the slot antenna and accordingly the efficiency of use of the magnetic flow of that wave having its wavefront along which the slots are formed is realized.

BEST MODES FOR CARRYING OUT THE INVENTION

Embodiments of the present invention are now described in detail with reference to the drawings.

First Embodiment

Figure 1:
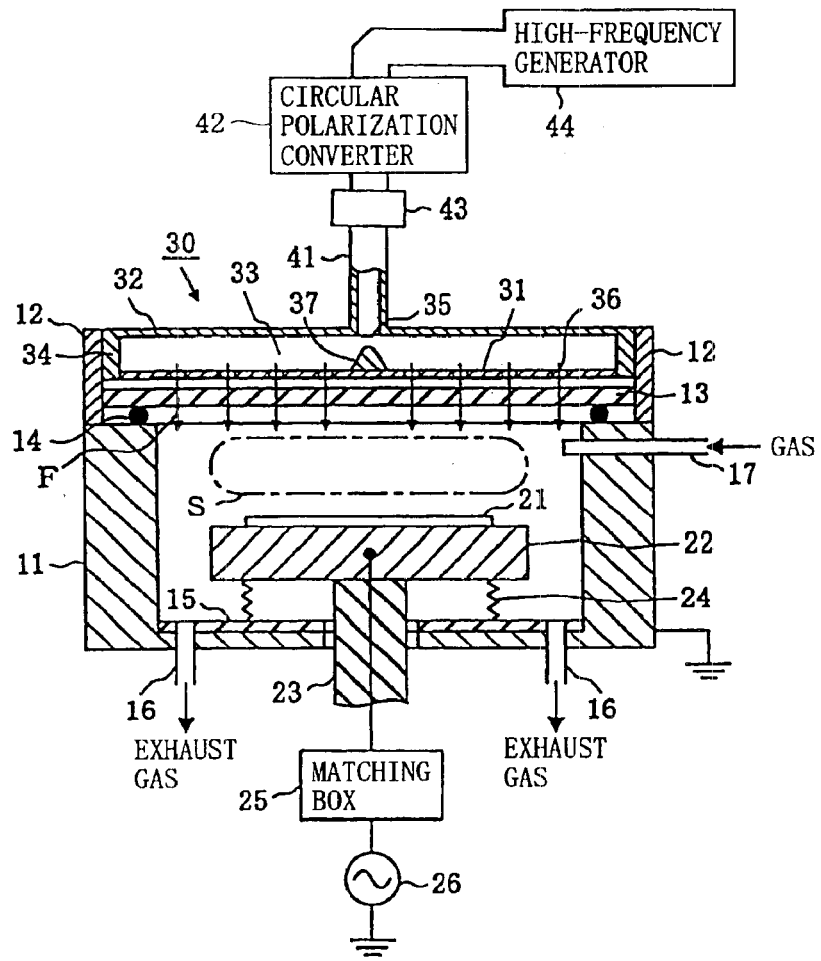
FIG. 1 shows a structure of a first embodiment of a plasma device according to the present invention.

FIG. 1 shows a structure of a first embodiment of a plasma device according to the present invention. The structure in FIG. 1 is partially shown in vertical cross section.

The plasma device has a process vessel 11 in the shape of a bottomed cylinder with its top opened. Process vessel 11 is formed of such a conductor as aluminum. On the top opening of process vessel 11, a dielectric plate 13 is placed that is formed of such a material as quartz glass or ceramic (e.g. $Al_2O_3$, AlN) having a thickness of approximately 20 to 30 mm. At the joint between process vessel 11 and dielectric plate 13, a sealing member 14 like an O-ring is provided to ensure airtightness of the inside of process vessel 11.

The bottom of process vessel 11 is provided with an insulating plate 15 of ceramic for example. In addition, an exhaust vent 16 is provided that passes through insulating plate 15 and the bottom of process vessel 11. A vacuum pump (not shown) communicating with this exhaust vent 16 produces a desired degree of vacuum in process vessel 11. Further, a nozzle 17 is provided in the sidewall of process vessel 11 for supplying a plasma gas like Ar or a process gas like $CF_4$ into process vessel 11. This nozzle 17 is formed of a quartz pipe, for example.

A cylindrical substrate platform 22 is housed in process vessel 11. Substrate platform 22 has its mount surface on which a substrate 21 to be processed is mounted. Some kind of chacks, for example Electro-Static Chacks, which settles substrate 21 tightly onto the mount surface of the substrate platform 22 may be included in the substrate platform 22. Substrate platform 22 is supported by an up-and-down shaft 23 passing to move freely through the bottom of process vessel 11 and thus the platform 22 is moved freely in the up-and-down direction. A high-frequency power supply 26 for biasing is connected to substrate platform 22 via a matching box 25. The output frequency of high-frequency power supply 26 is a predetermined frequency in the range from several hundreds of kHz to 10-odd MHz. For ensuring the airtightness within process vessel 11, a bellows 24 is provided between substrate platform 22 and insulating plate 15 to enclose up-and-down shaft 23.

Further, a radial antenna 30 which is one type of the slot antennas is placed above dielectric plate 13. This radial antenna 30 is separated by dielectric plate 13 from process vessel 11 and thus protected from a plasma generated in process vessel 11. Respective circumferential parts of radial antenna 30 and dielectric plate 13 are covered with a shield member 12 which is annually placed on the sidewall of process vessel 11 in order to prevent electromagnetic field F from escaping to the outside.

The central part of radial antenna 30 is connected by a cylindrical waveguide 41 to a high-frequency generator 44. High-frequency generator 44 generates high-frequency electromagnetic field F of a predetermined frequency in the range from 1 GHz to ten-odd GHz. At anywhere of cylindrical waveguide 41, a matching circuit 43 for impedance matching as well as a circular polarization converter 42 are provided that rotates the principal direction of an electric field propagating in cylindrical waveguide 41 about the axis of the waveguide. It is desirable that matching circuit 43 is placed between circular polarization converter 42 and radial antenna 30, however, matching circuit 43 may be placed between high-frequency generator 44 and circular polarization converter 42. The above-descried cylindrical waveguide 41, circular polarization converter 42, matching circuit 43 and high-frequency generator 44 constitute means for feeding circularly polarized electromagnetic field to radial antenna 30.

Radial antenna 30 has its structure as hereinafter described further in detail.

Radial antenna 30 is constituted of two circular electrically-conductive plates 31 and 32 parallel to each other to form a radial waveguide 33, and an electrically conductive ring 34 connecting respective circumferential parts of conductive plates 31 and 32 to serve as a shield. Conductive plates 31 and 32 and conductive ring 34 are each formed of such a conductor as copper and aluminum.

At a central part of conductive plate 32 forming the upper surface of radial waveguide 33, an inlet 35 for allowing electromagnetic field F into radial waveguide 33 is formed and, cylindrical waveguide 41 is connected to this inlet 35.

In radial waveguide 33 and at a central part of conductive plate 31, a conical member 37 protruding toward inlet 35 is provided. Conical member 37 is formed of the same conductor as that of conductive plates 31 and 32. Conical member 37 serves to appropriately direct electromagnetic field F propagating through cylindrical waveguide 41 into radial waveguide 33.

In conductive plate 31 forming the lower surface of radial waveguide 33, a plurality of slots 36 are formed for supplying electromagnetic field propagating within radial waveguide 33 into process vessel 11. This conductive plate 31 constitutes the radiation surface of radial antenna 30.

Figure 2:
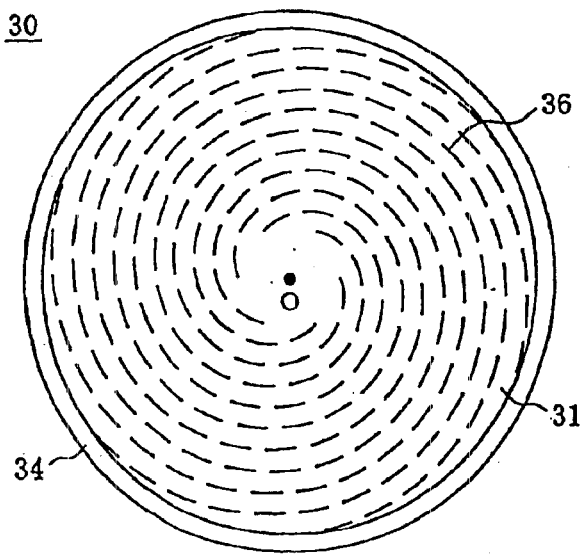
FIG. 2 is a plan view of a radiation surface of a radial antenna shown in FIG. 1.
Figure 3:
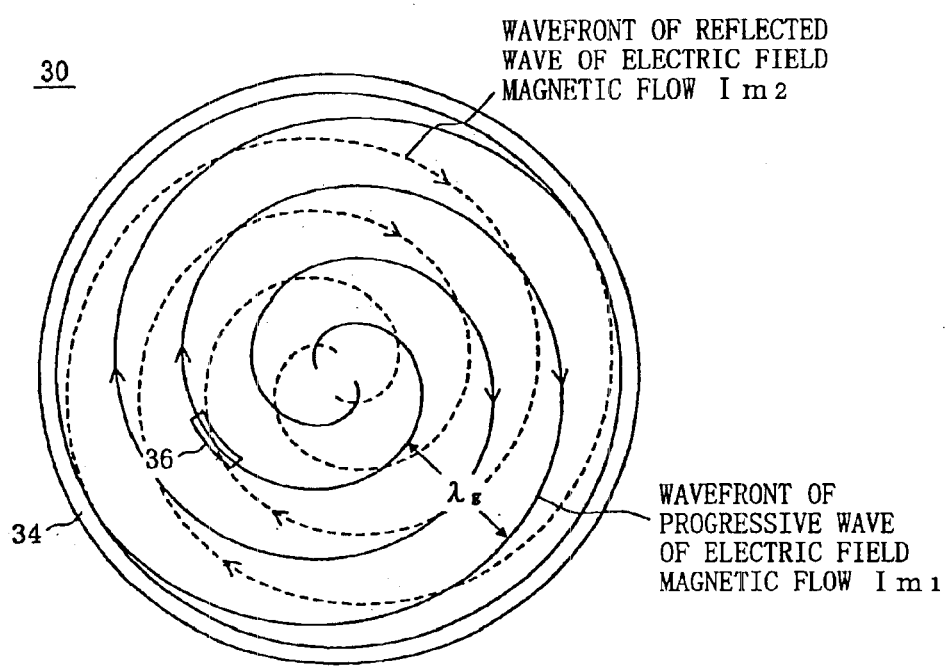
FIG. 3 conceptually shows wavefronts of an electromagnetic field at a certain instant in a radial waveguide.

FIG. 2 is a plan view of the radiation surface of radial antenna 30. FIG. 3 conceptually shows wavefronts of electromagnetic field F at a certain instant within radial waveguide 33.

When left-handed circular polarization is supplied to radial antenna 30, a progressive wave of electromagnetic field F in radial waveguide 33 has the helical wavefront as indicated by the solid line in FIG. 3, and a reflected wave has the helical wavefront as indicated by the dotted line in FIG. 3. Magnetic flow $I_{m1}$ of the progressive wave and magnetic flow $I_{m2}$ of the reflected wave are generated along respective wavefronts. The distance between the inner perimeter and the outer perimeter of the helix represents wavelength $\lambda g$ of electromagnetic field F in radial waveguide 33.

Slots 36 of this radial antenna 30 are formed along the wavefront of the progressive wave of electromagnetic field in radial waveguide 33. As shown in FIG. 2, slots are thus formed along the helix extending from the center toward the periphery of conductive plate 31. Slots 36 may be curved or linear in shape.

Figure 4:
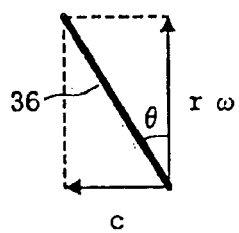
FIG. 4 illustrates a design method of slots of the radial antenna shown in FIG. 1.

FIG. 4 shows a design method of slots 36. Suppose that the circular polarization fed to radial antenna 30 has an angular frequency ω and a light velocity c, and the angle of inclination of slots 36 relative to the circumferential direction perpendicular to the radial direction of conductive plate 31 is represented by θ, slot 36 to be placed at a position separated by distance r from center O of conductive plate 31 is formed to satisfy a relation:

$$\theta = \tan^{-1}[c/(r\omega)].$$

Figure 5:
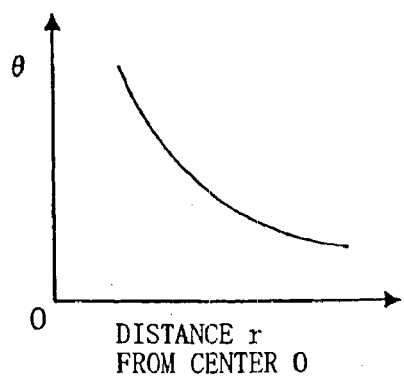
FIG. 5 conceptually shows change, in the radial direction, of the angle of inclination of the slots.

Light velocity c is constant while angular velocity rω increases with increase of r. Therefore, angle of inclination θ of slots 36 of this radial antenna 30 is not constant but decreases as shown in FIG. 5 as the position of the slots approaches the periphery from the center of conductive plate 31.

An operation of the plasma device shown in FIG. 1 is hereinafter described.

With substrate 21 placed on the mount surface of substrate platform 22, the degree of vacuum within process vessel 11 is adjusted to approximately 0.01 to 10 Pa, for example. This degree of vacuum is maintained while a plasma gas of Ar and a process gas of $CF_4$ are supplied from nozzle 17. In this state, feeding of circularly polarized electromagnetic field from high-frequency generator 44 to radial antenna 30 is started.

Electromagnetic field F which is output from high-frequency generator 44 propagates through cylindrical waveguide 41 in $TE_{11}$ mode, and the principal direction of the electric field is rotated about the axis of the waveguide by circular polarization converter 42 and, in this state, the field is supplied into radial waveguide 33 from inlet 35 of radial antenna 30.

Electromagnetic field F entering radial waveguide 33 propagates radially in radial waveguide 33 from the central part toward the periphery in TE mode and is radiated from a plurality of slots 36. Electromagnetic field F that is not radiated completely from slots 36 and thus reaches conductive ring 34 is reflected from the ring toward the central part again and goes back to the cylindrical waveguide 41 through inlet 35. Electromagnetic field F thereafter propagates in reciprocating manner in radial waveguide 33 and is gradually radiated from a plurality of slots 36.

As discussed above, slots 36 are formed along the wavefront of the progressive wave of electromagnetic field in radial waveguide 33. Then, the direction of slots 36 matches the direction of magnetic flow $I_{m1}$ generated along the wavefront of the progressive wave, and thus the efficiency of use of magnetic flow $I_{m1}$ of the progressive wave is improved. Accordingly, the progressive wave component increases in electromagnetic field F radiated from slots 36.

On the other hand, the reflected wave in radial waveguide 33 is weakened and magnetic flow $I_{m2}$ of the reflected wave accordingly decreases. Further, as the angle of inclination of magnetic flow $I_{m2}$ of the reflected wave relative to slots 36 is larger than the conventional one, the efficiency of use of magnetic flow $I_{m2}$ of the reflected wave is deteriorated. Then, the reflected wave component decreases in electromagnetic field F radiated from slots 36.

It is thus possible to selectively take and radiate the progressive wave by forming slots along the wavefront of the progressive wave in radial waveguide 33.

Electromagnetic field F radiated from radial antenna 30 passes through dielectric plate 13 to be supplied into process vessel 11. This electromagnetic field F then ionizes Ar atoms in process vessel 11 and generate a plasma in an upper space S above substrate 21 and $CF_4$ is dissociated. The energy and anisotropy of the plasma are controlled by a bias voltage applied to substrate platform 22 and, the plasma, together with CFx (x=1, 2, 3) attached to the surface of substrate 21, is used for the substrate 21.

Slots 36 of radial antenna 30 shown in FIG. 2 are formed along the wavefront of the progressive wave in order to selectively take the progressive wave of electromagnetic field in radial waveguide 33. The slots, however, may be formed along the wavefront of the reflected wave for selectively taking the reflected wave.

Regardless of whether the progressive wave is taken or the reflected wave is taken, the effect of the present invention is achieved by forming slots 36 at an angle of inclination θ with respect to the circumferential direction of the radiation surface of radial antenna 30 in such a way that angle of inclination θ of slots 36 decreases as the position of the slots approaches from the center of the radiation surface toward the periphery thereof.

Moreover, the distance between slots adjacent to each other in the radial direction of the radiation surface may be approximately λg to provide a radial antenna 30 of radiation type or the distance may be approximately λg/10 to λg/30 to provide a radial antenna 30 of leakage type.

Second Embodiment

A second embodiment of the plasma device according to the present invention is now described. The structure of the plasma device of the second embodiment is similar to that of the plasma device shown in FIG. 1 except for the radial antenna which supplies electromagnetic field F into process vessel 11, and thus description thereof is not repeated here.

Figure 6:
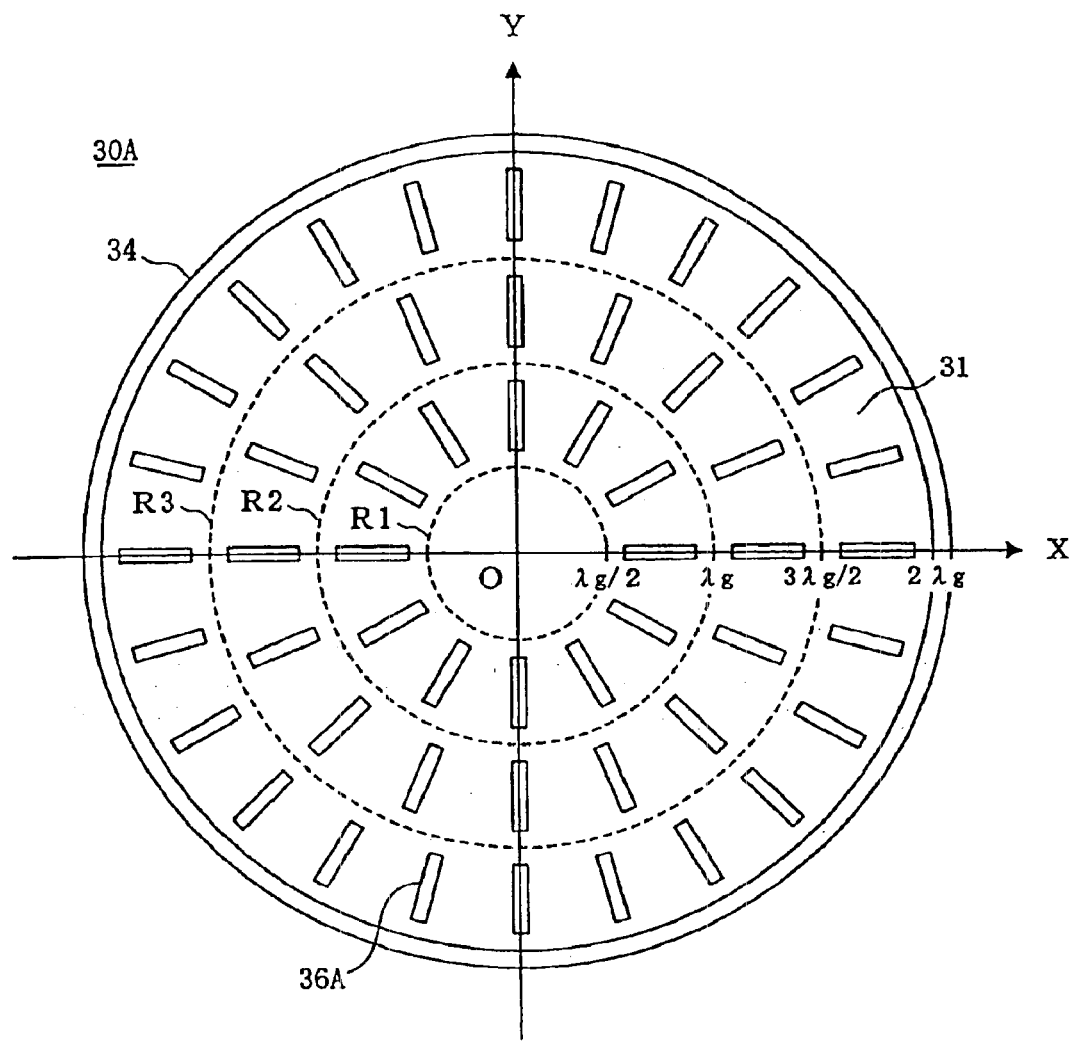
FIG. 6 is a plan view showing an exemplary structure of a radiation surface of a radial antenna employed in a second embodiment of the plasma device according to the present invention.

FIG. 6 is a plan view showing an exemplary structure of a radiation surface of a radial antenna employed in this embodiment. In FIG. 6, any component which is the same or corresponds to the component in FIG. 2 is denoted by the same reference character and description thereof is not repeated here as appropriate.

The radiation surface of radial antenna 30A is constituted of a circular electrically-conductive plate 31 with a radius of approximately 2·λg. Here, λg represents the wavelength of electromagnetic field in radial antenna 30A, namely in radial waveguide 33.

Conductive plate 31 is divided into four regions by three concentric circles R1, R2 and R3 having a common center which is the center O of conductive plate 31. These three concentric circles R1, R2 and R3 have respective radii of approximately λg/2, λg and 3·λg/2. Of the four regions of conductive plate 31, the region between R1 and R2, the region between R2 and R3 and the region between R3 and the perimeter each have a plurality of slots 36A formed in the radial direction.

Figure 7A:
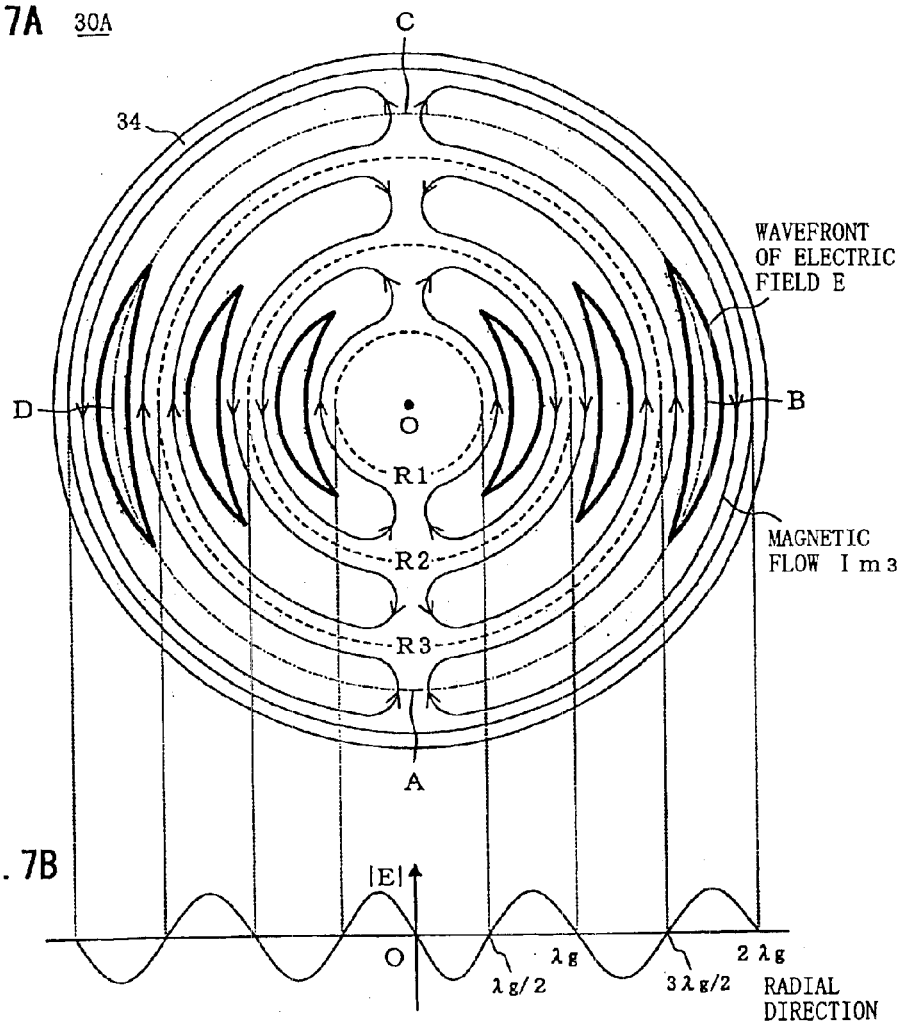
FIGS. 7A–7C illustrate a radiation principle of the radial antenna shown in FIG. 6.
Figure 7B:
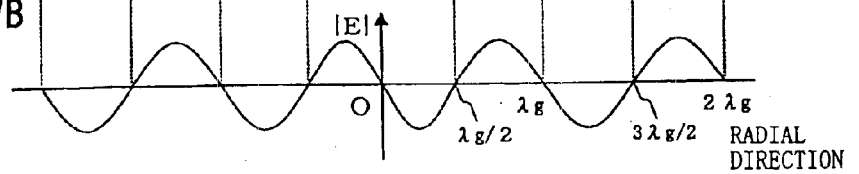
Figure 7C:
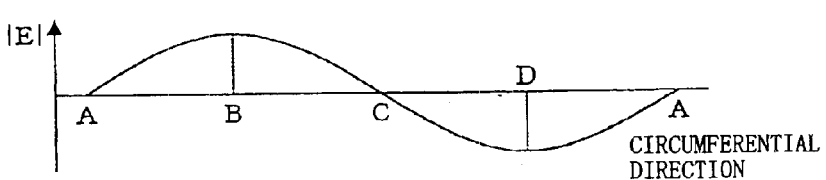

FIGS. 7A–7C illustrate a radiation principle of radial antenna 30A. FIG. 7A conceptually shows a wavefront of an electric field at a certain instant in radial waveguide 33, FIG. 7B shows a waveform of the electric field in the radial direction of radial waveguide 33, and FIG. 7C shows a waveform of the electric field in the circumferential direction of radial waveguide 33.

In radial antenna 30A fed with circularly polarized electromagnetic field, a progressive wave of electromagnetic field propagating radially from the central part toward the periphery of radial waveguide 33 overlaps a reflected wave reflected from conductive ring 34 toward the central part. Then, a standing wave appears in the radial direction of radial waveguide 33 that has a constant amplitude distribution of electric field E. The electric-field waveform of the standing wave in the radial direction is sinusoidal with a wave number of 4 (four) as shown in FIG. 7B, and nodes of the standing wave are located at respective distances of approximately λg/2, λg, 3·λg/2 and 2·λg from center O of radial waveguide 33. Respective positions of the nodes correspond to respective positions of concentric circles R1–R3 dividing conductive plate 31 into four regions.

Further, the electric-field waveform of the standing wave in the circumferential direction is sinusoidal with a wave number of 1 (one) as shown in FIG. 7C. Points A–D in FIG. 7C correspond respectively to points A–D in FIG. 7A.

The wavefront of electric field E of the standing wave is indicated by the bold line in FIG. 7A and magnetic flow $I_{m3}$ is generated along the wavefront.

Figure 8A:
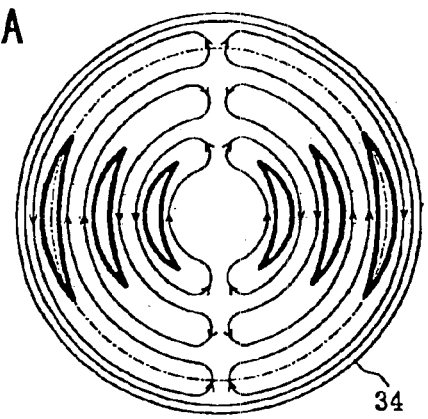
FIGS. 8A–8F conceptually show rotation of a standing wave in a radial waveguide.
Figure 8D:
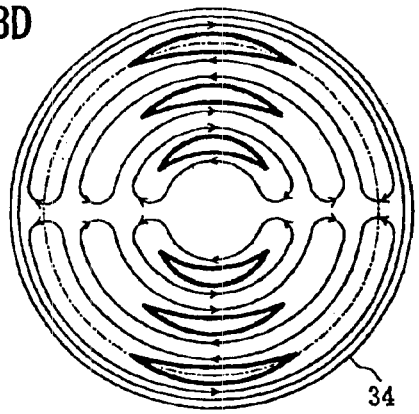
Figure 8B:
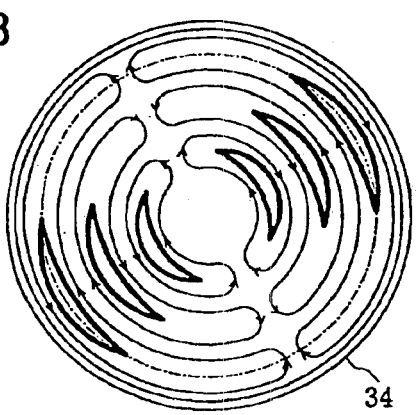
Figure 8E:
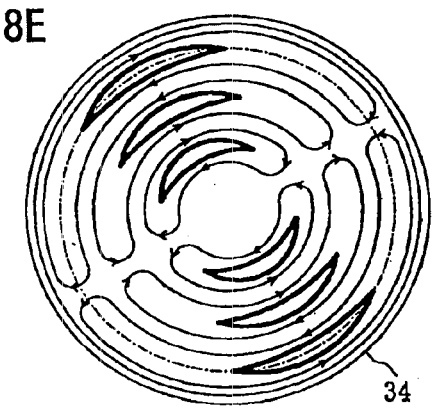
Figure 8C:
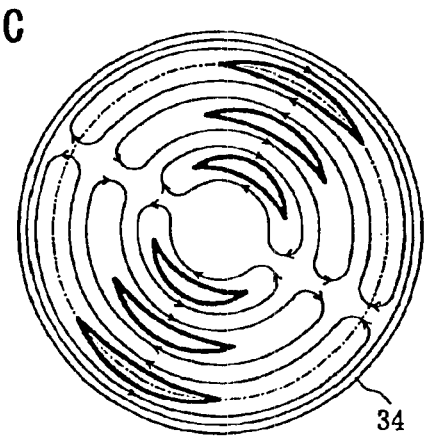
Figure 8F:
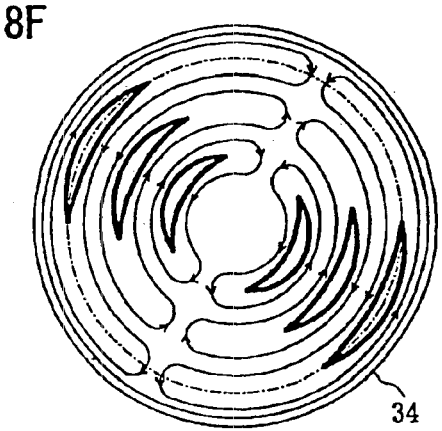

The standing wave with the constant amplitude distribution of electric field E in the radial direction is rotated in the circumferential direction of radial waveguide 33 at the same frequency as the frequency of electromagnetic field supplied to radial waveguide 33. For example, if the frequency of electromagnetic field is 2.45 GHz, the standing wave is rotated at the frequency of 2.45 GHz. As the manner shown conceptually in FIGS. 8A–8F, the standing wave is rotated. As shown in FIGS. 8B–8F, the phase advances by 30°, 60°, 90°, 120° and 150° with respect to the state of the phase shown in FIG. 8A. The fact that the standing wave is rotated in the circumferential direction means that the electric-field waveform in the circumferential direction shown in FIG. 7C is rotated in the circumferential direction.

Figure 9:
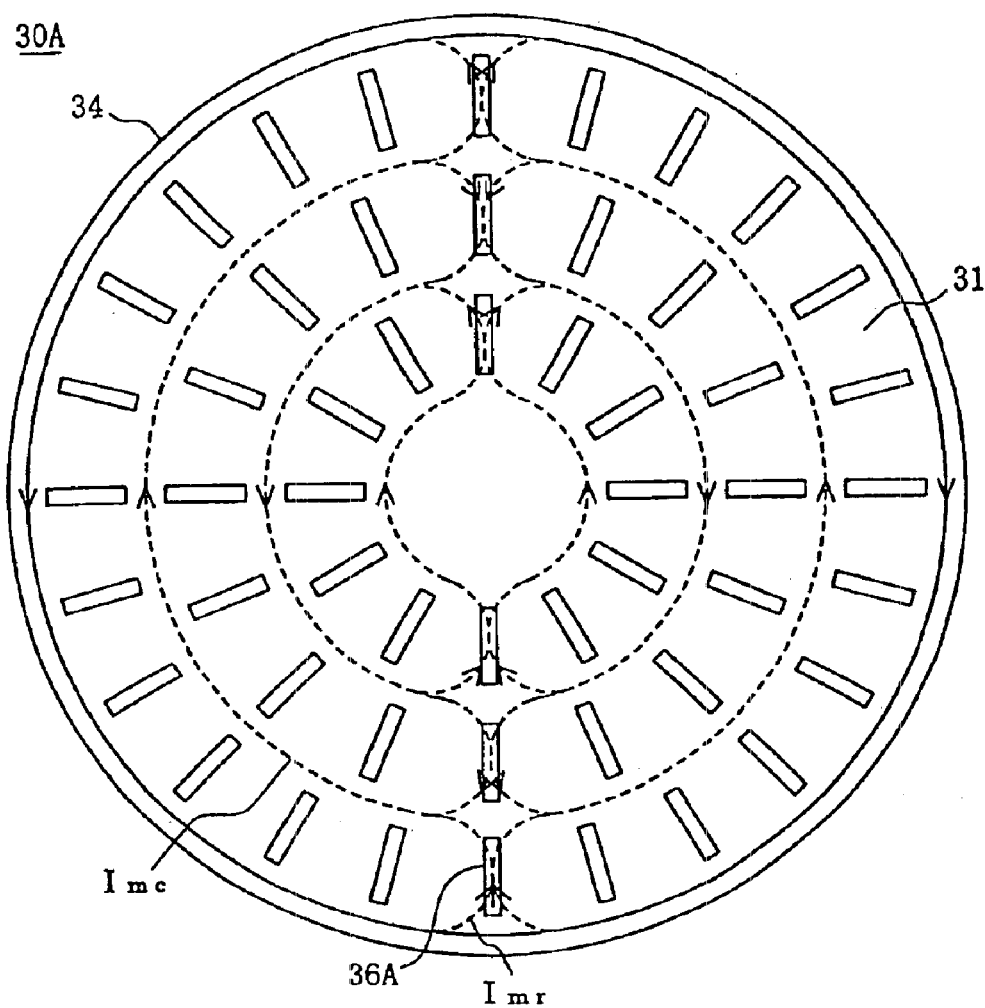
FIG. 9 illustrates a radiation principle of the radial antenna shown in FIG. 6.

The standing wave does not move in the radial direction. Then, assuming that there are partitions at respective nodes of the standing wave that are indicated by the dotted lines in FIG. 7A, radial waveguide 33 could be considered as a combination of rectangular waveguides having respective H planes that are curved into a ring and each having openings on respective ends connected to each other. Under this assumption, electric field E rotating in the circumferential direction of radial waveguide 33 may be regarded as electric fields propagating in the rectangular waveguides. In this case, electromagnetic field F is radiated by forming slots in E-planes of the rectangular waveguides in the direction perpendicular to the axis of the waveguides, and thus slots of radial waveguide 33 may be formed in the direction perpendicular to the circumferential direction. Here, E-plane refers to a plane where a virtual line of electric force of the electric field passes perpendicularly to the plane when an electromagnetic field of TE10 mode propagates in the rectangular waveguides, and H-plane refers to a plane perpendicular to E-plane. In actual, by forming slots 36A in the direction perpendicular to the circumferential direction, i.e., radial direction, electromagnetic field F is radiated from slots 36A when magnetic flow $I_{mr}$ of magnetic flow $I_{m3}$ that proceeds in the radial direction of radial waveguide 33 passes through slots 36A as shown in FIG. 9. At this time, the direction of magnetic flow $I_{mr}$ matches the direction of slots 36A and accordingly magnetic flow $I_{mr}$ can efficiently be used.

As discussed above, electromagnetic field F can be radiated by forming slots 36A in the radial direction in each of the regions of conductive plate 31 that are formed by dividing conductive plate 31 by concentric circles R1–R3. Respective positions of concentric circles R1–R3 correspond to respective positions of the nodes of the standing wave in radial waveguide 33. Therefore, if the radius of conductive plate 31 is approximately M×λg/2, the radius of concentric circles R1–R3 is approximately N×λg/2. If the radius of conductive plate 31 is approximately M×λg/2+λg/

4, the radius of concentric circles R1–R3 is approximately N×λg/2+λg/4. Here, M is an integer of at least 2 and N is an integer from 1 to (M−1).

The position of magnetic flow $I_{mr}$ in the radial direction of radial waveguide 33 rotates with the rotation of electric field E. Therefore, the distance between slots 36A adjacent to each other may be any arbitrary one.

Figure 10:
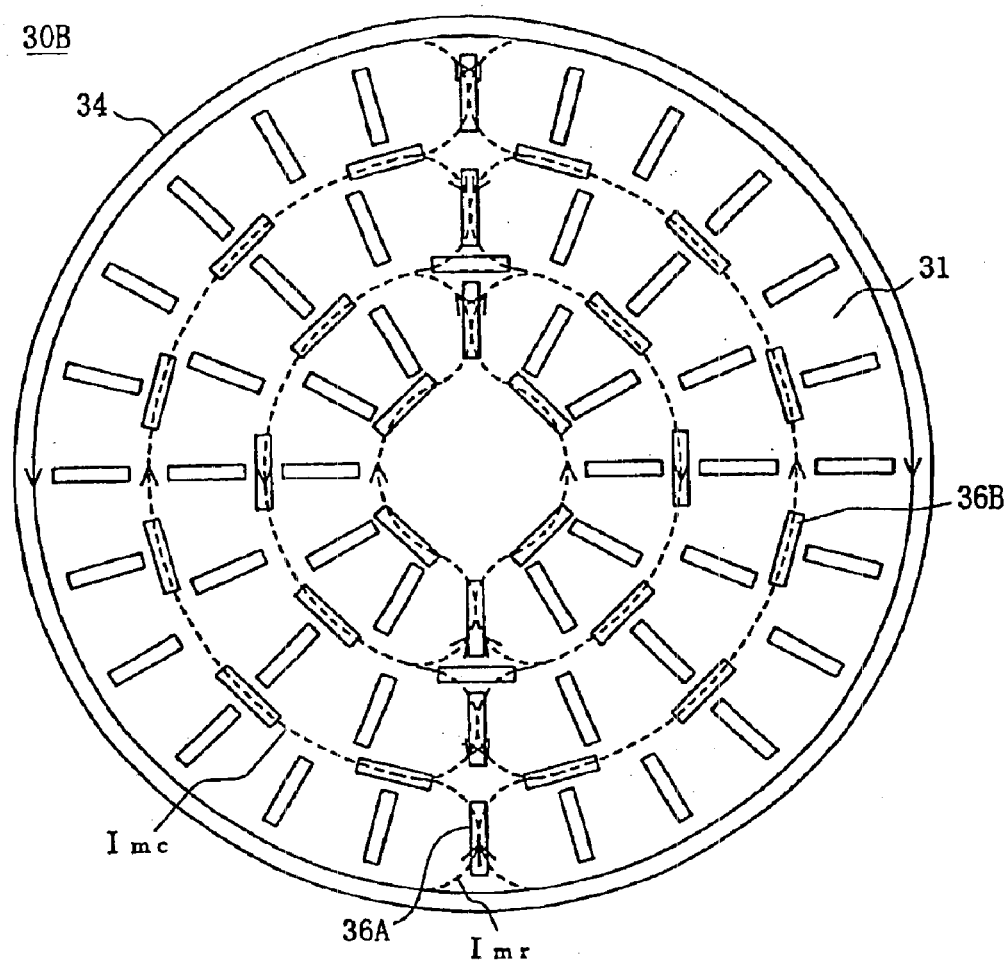
FIG. 10 is a plan view showing another exemplary structure of the radial antenna employed in the second embodiment of the plasma device according to the present invention.
Figure 11:
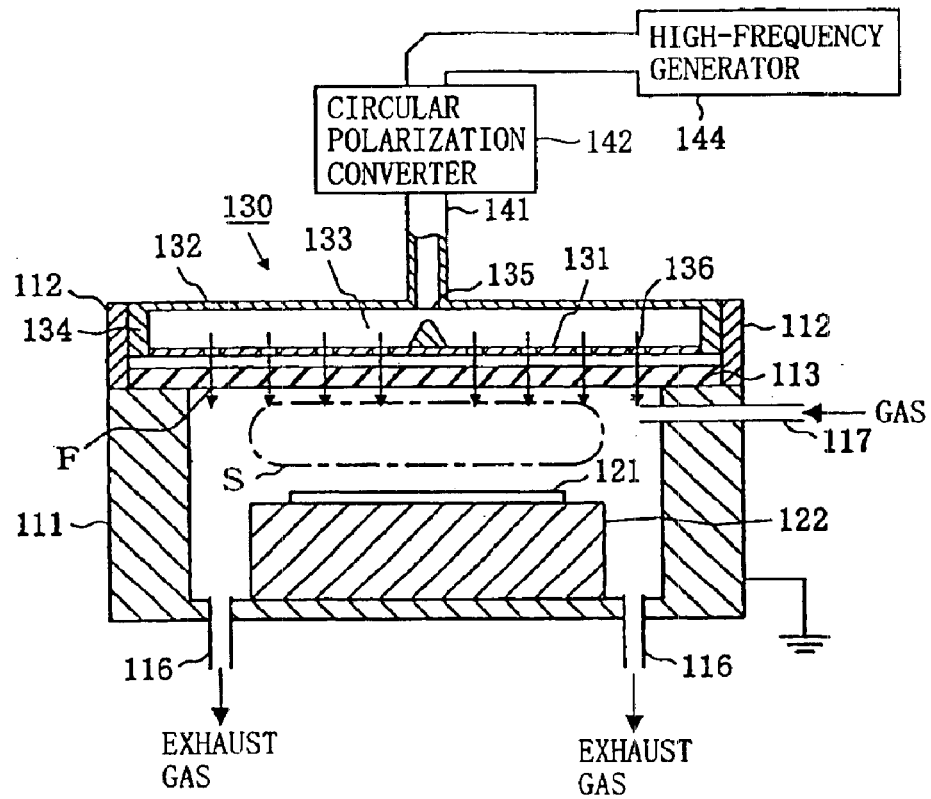
FIG. 11 shows an exemplary structure of a conventional plasma device.
Figure 12:
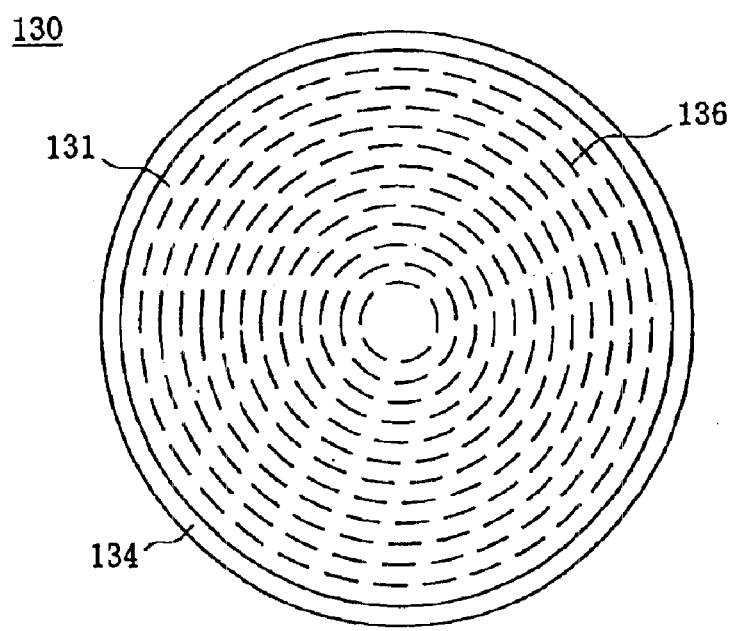
FIG. 12 is a plan view showing an exemplary structure of a radiation surface of a conventional radial antenna shown in FIG. 11.
Figure 13:
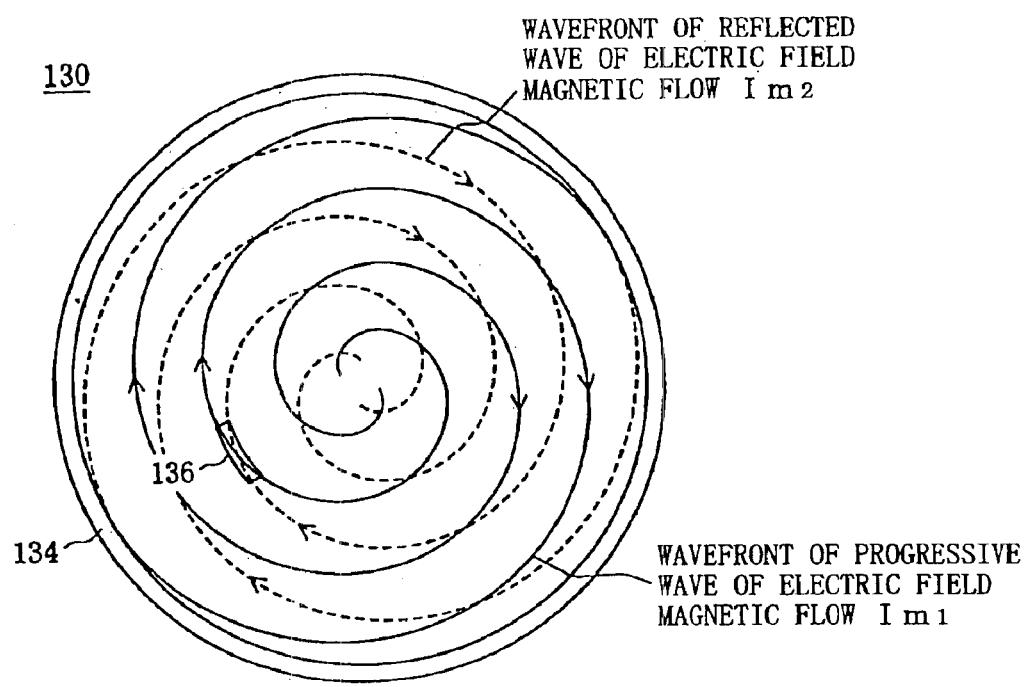
FIG. 13 conceptually shows wavefronts of electromagnetic field F at a certain instant in a radial waveguide.

FIG. 10 is a plan view showing another exemplary structure of the radial antenna employed in the second embodiment. Any component in FIG. 10 that is the same as or corresponds to the component shown in FIGS. 6–9 is denoted by the same reference character and description thereof is not repeated as appropriate.

In conductive plate 31 forming the radiation surface of a radial antenna 30B shown in FIG. 10, slots 36B are formed in the circumferential direction on concentric circles R1–R3 in addition to slots 36A in the radial direction of conductive plate 31. As described above, respective positions of concentric circles R1–R3 correspond respectively to nodes of the standing wave appearing in radial waveguide 33, and magnetic flow $I_{mc}$ of magnetic flow $I_{m3}$ that advances in the circumferential direction is generated at these positions. Then, slots 36B in the circumferential direction are formed on concentric circles R1–R3 to radiate electromagnetic field F from slots 36B. Further, as the direction of magnetic flow $I_{mc}$ matches the direction of slots 36B, efficient use of magnetic flow $I_{mc}$ is achieved. Slots 36B may be curved or linear in shape.

In this way, radial antenna 30B shown in FIG. 10 uses both of magnetic flow $I_{mr}$ and magnetic flow $I_{mc}$ and accordingly radial antenna 30B supplies electromagnetic field F into process vessel 11 more efficiently than radial antenna 30A shown in FIG. 6.

According to the present invention as heretofore discussed, a slot antenna is employed that has slots with the angle of inclination relative to the circumferential direction of the radiation surface that decreases as the position of the slots approaches the periphery of the radiation surface from the center thereof. With this slot pattern, the direction of the slots is closer to either the direction of the magnetic flow of the progressive wave of the electromagnetic field or the direction of the magnetic flow of the reflected wave in the antenna. Then, one of the efficiencies of use of the magnetic flow of the progressive wave and that of the reflected wave is improved while the other is deteriorated. Accordingly, a desired component of the electromagnetic field in the antenna is selectively taken to be supplied into the vessel for generating a plasma.

Further, according to the present invention, a slot antenna is employed that has slots formed along the wavefront of the electromagnetic field in the antenna. The slots are formed along the wavefront of selected one of the progressive wave, reflected wave and standing wave in the antenna to improve the efficiency of use of the magnetic flow of the selected wave. Thus, a desired component of the electromagnetic field in the slot antenna is efficiently supplied into the vessel for generating a plasma.

Industrial Applicability

The plasma device of the present invention is also applicable to ECR (electron cyclotron resonance) plasma device, and further applicable to etching device and plasma-enhanced CVD (chemical vapor deposition) device, for example.

What is claims is:

1. A plasma device comprising:

a slot antenna (30) having a radiation surface (31) and a plurality of slots (36) formed in the radiation surface (31) for supplying an electromagnetic field into a vessel (11); and feeding means (41, 42, 43, 44) for feeding circularly polarized electromagnetic field to said slot antenna (30), wherein said plurality of slots (36) are arranged in such a way that the angle of inclination of said slots relative to the circumferential direction of said radiation surface (31) of said slot antenna (30) decreases as the position of the slots approaches the periphery of said radiation surface (31) from the center of the radiation surface.

2. The plasma device according to claim 1, wherein said plurality of slots (36) of said slot antenna (30) are formed along a helix extending from the center toward the periphery of said radiation surface (31).

3. A plasma device comprising:

a slot antenna (30) having an internal portion (33), a radiation surface (31) and a plurality of slots (36) formed in the radiation surface (31) for supplying an electromagnetic field into a vessel (11); and feeding means (41, 42, 43, 44) for feeding circularly polarized electromagnetic field to said slot antenna (30), wherein said plurality of slots (36) of said slot antenna (30) are formed along a wavefront of the electromagnetic field in said internal portion (33) of said slot antenna (30).

4. A plasma generation method comprising the steps of:

preparing a slot antenna (30) having a radiation surface (31) and a plurality of slots (36) formed in the radiation surface (31), said plurality of slots (36) being arranged in such a way that the angle of inclination of said slots (36) relative to the circumferential direction of said radiation surface (31) decreases as the position of the slots approaches the periphery of said radiation surface (31) from the center of the radiation surface; and feeding circularly polarized electromagnetic field to said slot antenna (30) thereby supplying an electromagnetic field into a vessel (11) to generate a plasma.

5. The plasma generation method according to claim 4, wherein said plurality of slots (36) of said slot antenna (30) are formed along a helix extending from the center toward the periphery of said radiation surface (31).

6. A plasma generation method comprising the steps of:

preparing a slot antenna (30) having an internal portion (33), a radiation surface (31) and a plurality of slots (36) formed in the radiation surface (31), said plurality of slots (36) being formed along a wavefront of an electromagnetic field in said internal portion (33); and feeding circularly polarized electromagnetic field to said slot antenna (30) thereby supplying the electromagnetic field into a vessel (11) to generate a plasma.

* * * * *